(12) United States Patent
Kwon

(10) Patent No.: US 9,640,499 B2
(45) Date of Patent: May 2, 2017

(54) SEMICONDUCTOR CHIP, FLIP CHIP PACKAGE AND WAFER LEVEL PACKAGE INCLUDING THE SAME

(71) Applicant: Samsung Electronics Co., Ltd., Suwon-si, Gyeonggi-do (KR)

(72) Inventor: Heung Kyu Kwon, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/046,442

(22) Filed: Feb. 17, 2016

(65) Prior Publication Data
US 2016/0284655 A1    Sep. 29, 2016

(30) Foreign Application Priority Data

Mar. 25, 2015 (KR) .................. 10-2015-0041264

(51) Int. Cl.
| | | |
|---|---|---|
| H01L 23/00 | (2006.01) | |
| H01L 23/498 | (2006.01) | |
| H01L 23/525 | (2006.01) | |
| H01L 23/31 | (2006.01) | |

(52) U.S. Cl.
CPC ........ *H01L 24/09* (2013.01); *H01L 23/49827* (2013.01); *H01L 23/525* (2013.01); *H01L 24/17* (2013.01); *H01L 24/49* (2013.01); *H01L 23/3128* (2013.01); *H01L 23/3171* (2013.01); *H01L 23/49816* (2013.01); *H01L 2224/02331* (2013.01); *H01L 2224/0401* (2013.01); *H01L 2224/04042* (2013.01); *H01L 2224/04105* (2013.01); *H01L 2224/0912* (2013.01); *H01L 2924/00014* (2013.01)

(58) Field of Classification Search
CPC . H01L 24/09; H01L 23/3114; H01L 23/3171; H01L 23/528; H01L 24/17; H01L 24/49
See application file for complete search history.

(56) References Cited

U.S. PATENT DOCUMENTS

| | | |
|---|---|---|
| 5,885,855 A | 3/1999 | Liang |
| 6,650,014 B2 | 11/2003 | Kariyazaki |
| 7,915,718 B2 | 3/2011 | Lee et al. |
| 8,373,073 B2 | 2/2013 | Ito et al. |
| 8,384,185 B2 | 2/2013 | Ito et al. |

(Continued)

FOREIGN PATENT DOCUMENTS

| | | |
|---|---|---|
| JP | 2010206053 | 9/2010 |
| JP | 2012204575 | 10/2012 |

*Primary Examiner* — Karen Kusumakar
(74) *Attorney, Agent, or Firm* — Renaissance IP Law Group LLP

(57) ABSTRACT

A semiconductor chip may include a semiconductor substrate, a first central pad, a second central pad, a first peripheral pad, a second peripheral pad, a first pad line and a second pad line. The semiconductor substrate may have an active face. The first central pad and the second central pad may be arranged on a central region of the active face. The first peripheral pad and the second peripheral pad may be arranged on an edge region of the active face. The first pad line may be connected between the first central pad and the first peripheral pad. The second pad line may be connected between the second central pad and the second peripheral pad.

17 Claims, 19 Drawing Sheets

(56) References Cited

U.S. PATENT DOCUMENTS

| | | | | |
|---|---|---|---|---|
| 8,659,170 B2* | 2/2014 | Kuo | ............... | H01L 21/76838 |
| | | | | 257/737 |
| 2001/0033021 A1* | 10/2001 | Shimoishizaka | ... | H01L 23/3114 |
| | | | | 257/737 |
| 2002/0151103 A1* | 10/2002 | Nakamura | ......... | H01L 23/3128 |
| | | | | 438/106 |
| 2004/0222487 A1* | 11/2004 | Tanabe | ............... | H01L 23/3114 |
| | | | | 257/508 |
| 2005/0040543 A1* | 2/2005 | Watanabe | .......... | H01L 23/3114 |
| | | | | 257/781 |
| 2005/0248011 A1 | 11/2005 | Jung et al. | | |

* cited by examiner

SEMICONDUCTOR CHIP, FLIP CHIP PACKAGE AND WAFER LEVEL PACKAGE INCLUDING THE SAME

CROSS-RELATED APPLICATION

This application claims priority under 35 USC §119 to Korean Patent Application No. 10-2015-0041264, filed on Mar. 25, 2015 in the Korean Intellectual Property Office (KIPO), the contents of which are herein incorporated by reference in their entirety.

BACKGROUND

1. Field

Example embodiments relate to a semiconductor chip, a flip chip package and a wafer level package including the semiconductor chip. More particularly, example embodiments relate to a pad arrangement of a semiconductor chip, a flip chip package and a wafer level package including the semiconductor chip.

2. Description of the Related Art

Generally, a semiconductor chip may include peripheral pads arranged on an edge region of the semiconductor chip, and central pads arranged on a central region of the semiconductor chip. The peripheral pads may include an input pad, an output pad, a test pad, for example. The central pads may include a signal pad.

According to related arts, a peripheral pad may be used only for a test pad of a semiconductor package test or a bonding pad of a conductive wire. A central pad may be used for bonding pads in a flip chip package or a connecting pad of a redistribution layer in a wafer level package. That is, a peripheral pad may not be used for the bonding pad in the flip chip package or the connecting pad of the redistribution layer in the wafer level package. When an interval between the central pads corresponds to a fine pitch between conductive bumps in the flip chip package, an electrical short may occur among the conductive bumps. As a result, in order to prevent the electrical short among the conductive bumps, the flip chip package may have a large size. Particularly, in order to electrically connect the semiconductor chips with a package substrate in a system-in-package (SIP), the package substrate may have a large size.

SUMMARY

A semiconductor chip is provided to include peripheral pads and central pads. The peripheral pads and the central pads may be used for bonding pads between the semiconductor chip and a package substrate in a flip chip package or connecting pads of a redistribution layer in a wafer level package.

A flip chip package including the above-mentioned semiconductor chip is provided.

A wafer level package including the above-mentioned semiconductor chip is provided.

According to one aspect of example embodiments, a semiconductor chip is provided. The semiconductor chip may include a semiconductor substrate, a first central pad, a second central pad, a first peripheral pad, a second peripheral pad, a first pad line and a second pad line. The semiconductor substrate may have an active face. The first central pad and the second central pad may be arranged on a central region of the active face. The first peripheral pad and the second peripheral pad may be arranged on an edge region of the active face. The first pad line may electrically connect the first central pad and the first peripheral pad. The second pad line may electrically connect the second central pad and the second peripheral pad.

In example embodiments, the first central pad and the second central pad may be positioned adjacent to each other. The first peripheral pad and the second peripheral pad may be positioned adjacent to each other.

In example embodiments, the first peripheral pad and the second peripheral pad may be arranged in a row along a first direction substantially parallel to a side surface of the semiconductor substrate.

In example embodiments, the first central pad and the second central pad may be arranged in a row along the first direction.

In example embodiments, the first central pad and the second central pad may be arranged in a row along a second direction substantially perpendicular to the first direction.

In example embodiments, the first central pad and the second central pad are arranged offset from each other in the first direction and the second direction.

In example embodiments, the first central pad, the first peripheral pad and the first pad line may have upper surfaces substantially coplanar with each other.

In example embodiments, the second central pad, the second peripheral pad and the second pad line may have upper surfaces substantially coplanar with each other.

In example embodiments, the semiconductor chip may further include a passivation layer formed on the active surface to cover the first pad line and the second pad line. The passivation layer may have openings configured to expose the first central pad, the second central pad, the first peripheral pad and the second peripheral pad.

According to another aspect of example embodiments, a flip chip package is provided. The flip chip package may include a semiconductor chip, a package substrate, a first conductive bump and a second conductive bump. The semiconductor chip may include a semiconductor substrate, a first central pad, a first peripheral pad, a first pad line electrically connecting the first central pad with the first peripheral pad, a second central pad, a second peripheral pad, and a second pad line electrically connecting the second central pad with the second peripheral pad. The semiconductor substrate may have an active face. The first central pad and the second central pad may be arranged on a central region of the active face. The first peripheral pad and the second peripheral pad may be arranged on an edge region of the active face. The package substrate may be disposed opposite to the active face of the semiconductor chip. The first conductive bump and the second conductive bump may be disposed between the semiconductor chip and the package substrate to electrically connect the semiconductor chip with the package substrate.

In example embodiments, the first conductive bump may be disposed between the first central pad and the package substrate. The second conductive bump may be disposed between the second central pad and the package substrate.

In example embodiments, the first conductive bump may be disposed between the first peripheral pad and the package substrate. The second conductive bump may be disposed between the second peripheral pad and the package substrate.

In example embodiments, the first conductive bump may be disposed between the first central pad and the package substrate. The second conductive bump may be disposed between the second peripheral pad and the package substrate.

In example embodiments, the flip chip package may further include a molding member formed on the package substrate to cover the semiconductor chip.

In example embodiments, the flip chip package may further include a second semiconductor chip stacked on the semiconductor chip. The second semiconductor chip may be electrically connected with the package substrate.

In example embodiments, the flip chip package may further include a conductive wire electrically connecting the second semiconductor chip and the package substrate.

According to another aspect of example embodiments, a wafer level package is provided. The wafer level package may include a semiconductor chip, a first redistribution layer, a second redistribution layer and external terminals. The semiconductor chip may include a semiconductor substrate, a first central pad, a first peripheral pad, a first pad line electrically connecting the first central pad with the first peripheral pad, a second central pad, a second peripheral pad, and a second pad line electrically connecting the second central pad with the second peripheral pad. The semiconductor substrate may have an active face. The first central pad and the second central pad may be arranged on a central region of the active face. The first peripheral pad and the second peripheral pad may be arranged on an edge region of the active face. The first redistribution layer may be extended from any one of the first central pad and the first peripheral pad. The second redistribution layer may be extended from any one of the second central pad and the second peripheral pad. A first external terminal may be formed on the first redistribution layer and a second external terminal may be formed on the second redistribution layer.

In example embodiments, the wafer level package may further comprise a passivation layer formed on the active face to cover the first pad line and the second pad line. The passivation layer may have openings to expose the first central pad, the second central pad, the first peripheral pad and the second peripheral pad. The first redistribution layer and the second redistribution layer may be formed on the passivation layer In example embodiments, the wafer level package may further include an insulating pattern formed on an upper surface of the passivation layer. The insulating pattern may have openings configured to partially expose the first redistribution layer and the second redistribution layer.

In example embodiments, the second redistribution layer is spaced apart from the second central pad and the second peripheral pad.

According to another aspect of example embodiments, a semiconductor chip may include a semiconductor substrate having an active face; a plurality of central pads disposed on a central region of the active face, a plurality of peripheral pads disposed on an edge region of the active face along at least one side of the semiconductor substrate; and a plurality of paired electrical connection structures. Each paired electrical connection structure may be formed by one central pad and one corresponding peripheral pad and a pad line electrically connecting the one central pad with the one corresponding peripheral pad.

In example embodiments, at least two central pads may be arranged adjacent to each other and at least two peripheral pads may be arranged adjacent to each other to form two adjacent paired electrical connection structures.

According to example embodiments, the first central pad and the first peripheral pad may be connected with each other by the first pad line, and the second central pad and the second peripheral pad may be connected with each other by the second pad line. Thus, the first peripheral pad and the second peripheral pad as well as the first central pad and the second central pad may be used for a bonding pad in the flip chip package or a connecting pad of the redistribution layer the wafer level package. As a result, a pitch between the conductive bumps may be widened so that the semiconductor chip may be used for the flip chip package, the wafer level package, a fan-out wafer level package, etc., without changes of pad arrangements.

BRIEF DESCRIPTION OF THE DRAWINGS

Example embodiments will be more clearly understood from the following detailed description taken in conjunction with the accompanying drawings.

FIG. 1 is a plan view illustrating a semiconductor chip in accordance with example embodiments;

FIG. 2 is a cross-sectional view taken along a line II-II' in FIG. 1;

FIG. 3 is a cross-sectional view taken along a line in FIG. 1;

FIG. 4 is a cross-sectional view illustrating a flip chip package including the semiconductor chip in FIG. 1 in accordance with example embodiments;

FIG. 5 is a plan view illustrating the flip chip package in FIG. 4;

FIG. 6 is a cross-sectional view taken along a line VI-VI' in FIG. 5;

FIG. 7 is a cross-sectional view taken along a line VII-VII' in FIG. 5;

FIG. 8 is a cross-sectional view illustrating a flip chip package including the semiconductor chip in FIG. 1 in accordance with example embodiments;

FIG. 9 is a plan view illustrating the flip chip package in FIG. 8;

FIG. 10 is a cross-sectional view taken along a line X-X' in FIG. 8;

FIG. 11 is a cross-sectional view taken along a line XI-XI' in FIG. 8;

FIG. 12 is a cross-sectional view illustrating a flip chip package including the semiconductor chip in FIG. 1 in accordance with example embodiments;

FIG. 13 is a plan view illustrating the flip chip package in FIG. 12;

FIG. 14 is a cross-sectional view taken along a line XIV-XIV' in FIG. 12;

FIG. 15 is a cross-sectional view taken along a line XV-XV' in FIG. 12;

FIG. 16 is a cross-sectional view illustrating a wafer level package including the semiconductor chip in FIG. 1 in accordance with example embodiments;

FIG. 17 is a cross-sectional view taken along a line XVII-XVII' in FIG. 16;

FIG. 18 is a cross-sectional view taken along a line XVIII-XVIII' in FIG. 16; and FIG. 19 is a cross-sectional view illustrating a system-in-package including the semiconductor chip in FIG. 1 in accordance with example embodiments.

DETAILED DESCRIPTION OF THE EMBODIMENTS

Figure 1:
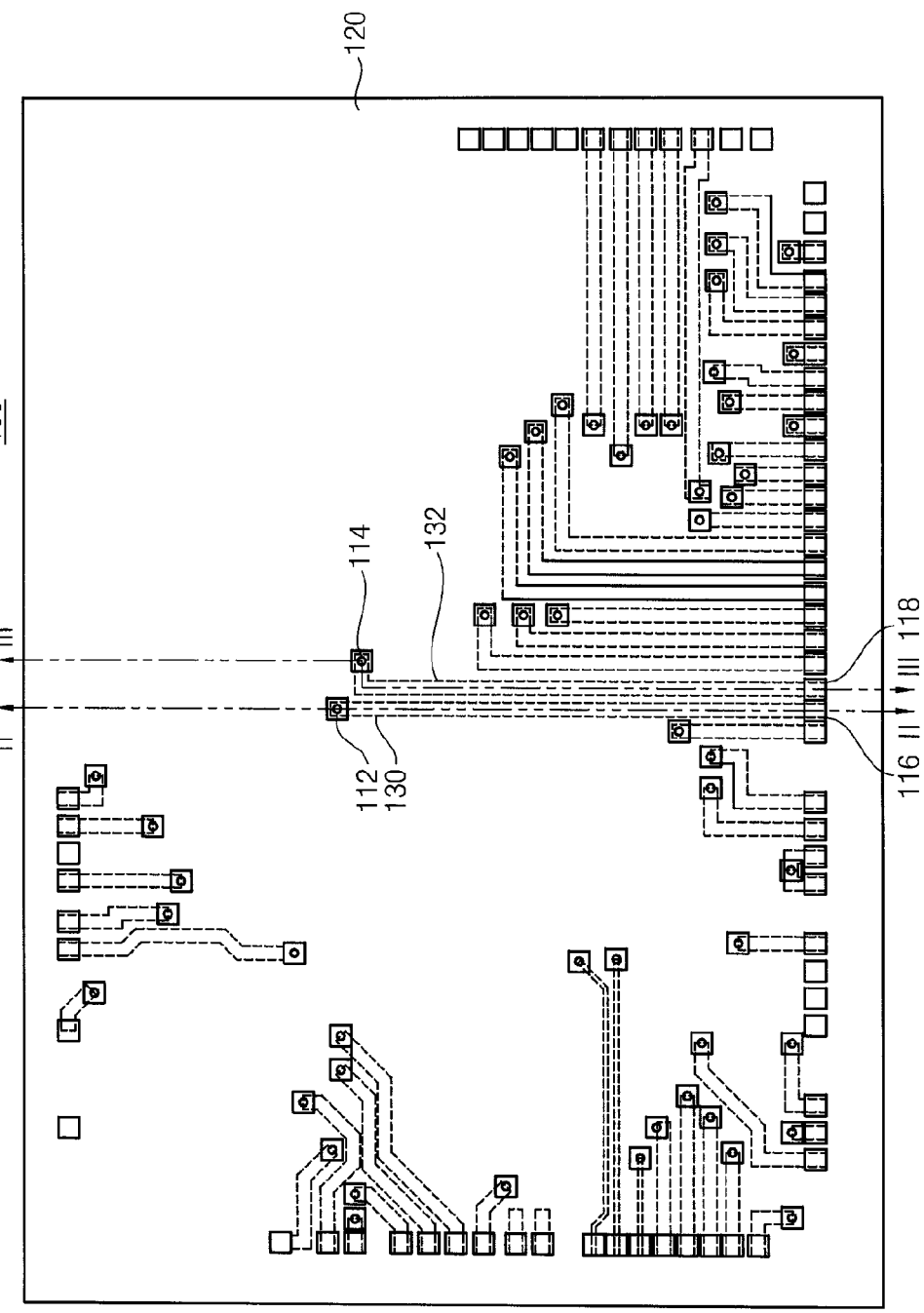
FIGS. 1 to 19 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Semiconductor Chip

Figure 2:
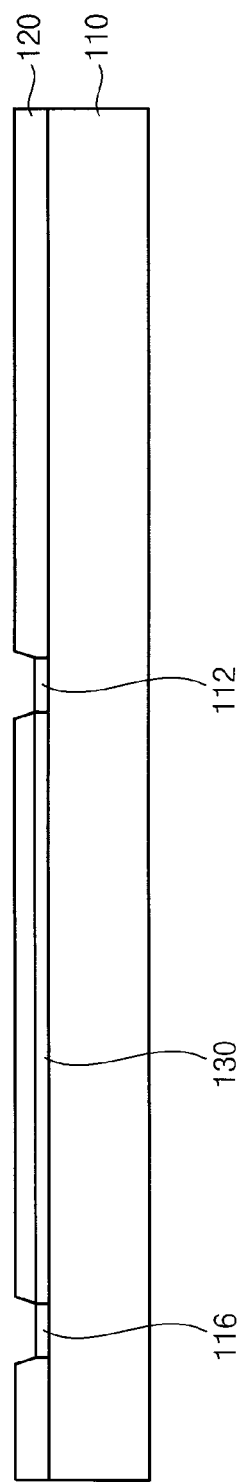
Figure 3:
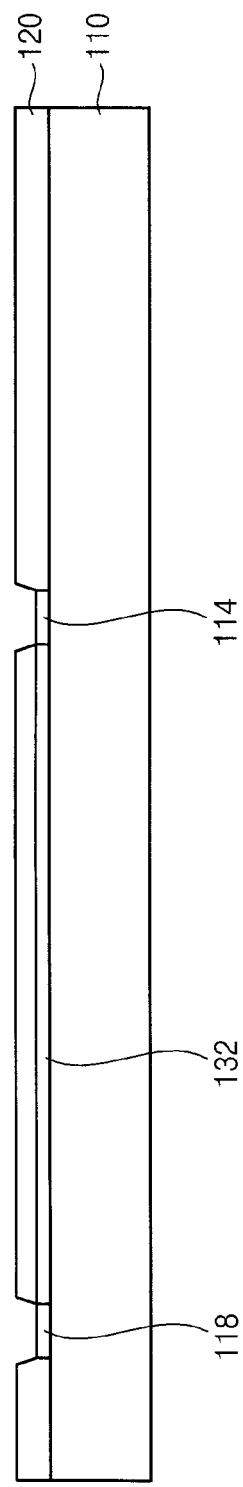

FIG. 1 is a plan view illustrating a semiconductor chip in accordance with example embodiments, FIG. 2 is a cross-sectional view taken along a line II-II' in FIG. 1, and FIG. 3 is a cross-sectional view taken along a line in FIG. 1.

Referring to FIGS. 1 to 3, a semiconductor chip 100 of this example embodiment may include a semiconductor substrate 110, a plurality of central pads, a plurality of peripheral pads, a plurality of pad lines and a passivation layer 120.

In some embodiments, the number of the central pads in the semiconductor substrate 110 may be N. The number of the peripheral pads in the semiconductor substrate 110 may also be N. A pad line may be disposed between a central pad and a peripheral pad to electrically connect the central pad with the peripheral pad. Thus, the central pad and the peripheral pad may be paired with and electrically connected to each other to form a paired electrical connection structure. In example embodiments, a first central pad 112 and a second central pad 114 may be adjacent to each other among the N central pads, a first peripheral pad 116 and a second peripheral pad 118 may be adjacent to each other among the N peripheral pads. A first pad line 130 may be disposed between the first central pad 112 and the first peripheral pad 116, and a second pad line 132 may be disposed between the second central pad 114 and the second peripheral pad 118.

The semiconductor substrate 110 may include circuit structures. The circuit structures may be formed in the semiconductor substrate 110. The semiconductor substrate 110 may have an active face electrically connected to the circuit structures. In FIGS. 2 and 3, the active face may correspond to an upper surface of the semiconductor substrate 110.

The first central pad 112 and the second central pad 114 may be positioned on a central region of the active face in the semiconductor substrate 110. The central region may be a region closer to a center of the semiconductor substrate 110 than an edge region of the semiconductor substrate 110. The first central pad 112 and the second central pad 114 may be arranged adjacent to each other. In some embodiments, there may be no other pads disposed between the first central pad 112 and the second central pad 114. In one embodiment, the first central pad 112 and the second central pad 114 may be arranged in a row parallel to one side of the semiconductor substrate 110. In another embodiment, the first central pad 112 and the second central pad 114 may be arranged offset from each other in two directions parallel with each other.

Thus, the first central pad 112 and the second central pad 114 may not be arranged in a row.

The first peripheral pad 116 and the second peripheral pad 118 may be positioned on an edge region of the active face in the semiconductor substrate 110. The first peripheral pad 116 and the second peripheral pad 118 may be arranged adjacent to each other. In some embodiments, there may be no other pads disposed between the first peripheral pad 116 and the second peripheral pad 118. Further, the first peripheral pad 116 and the second peripheral pad 118 may be arranged in a row along a direction substantially parallel to a side surface of the semiconductor substrate 110.

In some embodiments, a row formed by the first central pad 112 and the second central pad 114 may be parallel to the row formed by the first peripheral pad 116 and the second peripheral pad 118. In some embodiments, the row formed by the first central pad 112 and the second central pad 114 may be substantially perpendicular to the row formed by the first peripheral pad 116 and the second peripheral pad 118.

The first pad line 130 may be arranged on the active face of the semiconductor substrate 110. The first pad line 130 may be disposed between the first central pad 112 and the first peripheral pad 116, and may electrically connect the first central pad 112 with the first peripheral pad 116. Thus, the first central pad 112 and the first peripheral pad 116 may form a pair of electrical connection structure connected by the first pad line 130.

The first pad line 130 may be formed by a process for forming the first central pad 112 and the first peripheral pad 116. For example, a metal layer may be formed on the active face of the semiconductor substrate 110. The metal layer may be patterned to simultaneously form the first central pad 112, the first peripheral pad 116 and the first pad line 130. Thus, the first central pad 112, the first peripheral pad 116 and the first pad line 130 may have upper surfaces substantially coplanar with each other.

Alternatively, the first pad line 130 may be formed by a process different from a process for forming the first central pad 112 and the first peripheral pad 116. For example, after forming the first central pad 112 and the first peripheral pad 116 on the active face of the semiconductor substrate 110, the first pad line 130 may be formed between the first central pad 112 and the first peripheral pad 116. In this case, an upper surface of the first pad line 130 may be higher or lower than upper surfaces of the first central pad 112 and the first peripheral pad 116.

The second pad line 132 may be arranged on the active face of the semiconductor substrate 110. The second pad line 132 may be disposed between the second central pad 114 and the second peripheral pad 118, and may electrically connect the second central pad 114 with the second peripheral pad 118. Thus, the second central pad 114 and the second peripheral pad 118 may form a pair of electrical connection structure connected by the second pad line 133.

The second pad line 132 may be formed by a process for forming the second central pad 114 and the second peripheral pad 118. For example, a metal layer may be formed on the active face of the semiconductor substrate 110. The metal layer may be patterned to simultaneously form the second central pad 114, the second peripheral pad 118 and the second pad line 132. Thus, the second central pad 114, the second peripheral pad 118 and the second pad line 132 may have upper surfaces substantially coplanar with each other. That is, the first central pad 112, the second central pad 114, the first peripheral pad 116, the second peripheral pad 118, the first pad line 130 and the second pad line 132 may be formed simultaneously with each other by the single patterning process.

Alternatively, the second pad line 132 may be formed by a process different from a process for forming the second central pad 114 and the second peripheral pad 118. For example, after forming the second central pad 114 and the second peripheral pad 118 on the active face of the semiconductor substrate 110, the second pad line 132 may be formed between the second central pad 114 and the second peripheral pad 118. In this case, an upper surface of the second pad line 132 may be higher or lower than upper surfaces of the second central pad 114 and the second peripheral pad 118.

The passivation layer 120 may be formed on the active face of the semiconductor substrate 110. The passivation layer 120 may be configured to cover the first pad line 130 and the second pad line 132. The passivation layer 120 may have openings configured to expose the first central pad 112, the second central pad 114, the first peripheral pad 116 and the second peripheral pad 118.

According to the example embodiment, the first central pad 112 and the first peripheral pad 116 may be connected with each other by the first pad line 130, and the second central pad 114 and the second peripheral pad 118 may be connected with each other by the second pad line 132. Thus, any one of the first central pad 112 and the first peripheral pad 116 and any one of the second central pad 114 and the second peripheral pad 118 may be used as a terminal for a semiconductor package. As a result, the semiconductor chip 100 having the pad arrangement may be used for a flip chip package, a wafer level package, a fan-out wafer level package, etc.

In some embodiments, a semiconductor chip may comprise a semiconductor substrate having an active surface; a plurality of central pads disposed on a central region of the active surface; a plurality of peripheral pads disposed on an edge region of the active face along at least one side of the semiconductor substrate; and a plurality of paired electrical connection structures. Each paired electrical connection structure may be formed by one central pad and one corresponding peripheral pad and a pad line electrically connecting the one central pad with the one corresponding peripheral pad. In some embodiments, at least two central pads may be arranged adjacent to each other and at least two peripheral pads may be arranged adjacent to each other to form at least two adjacent paired electrical connection structures.

Flip Chip Package

Figure 4:
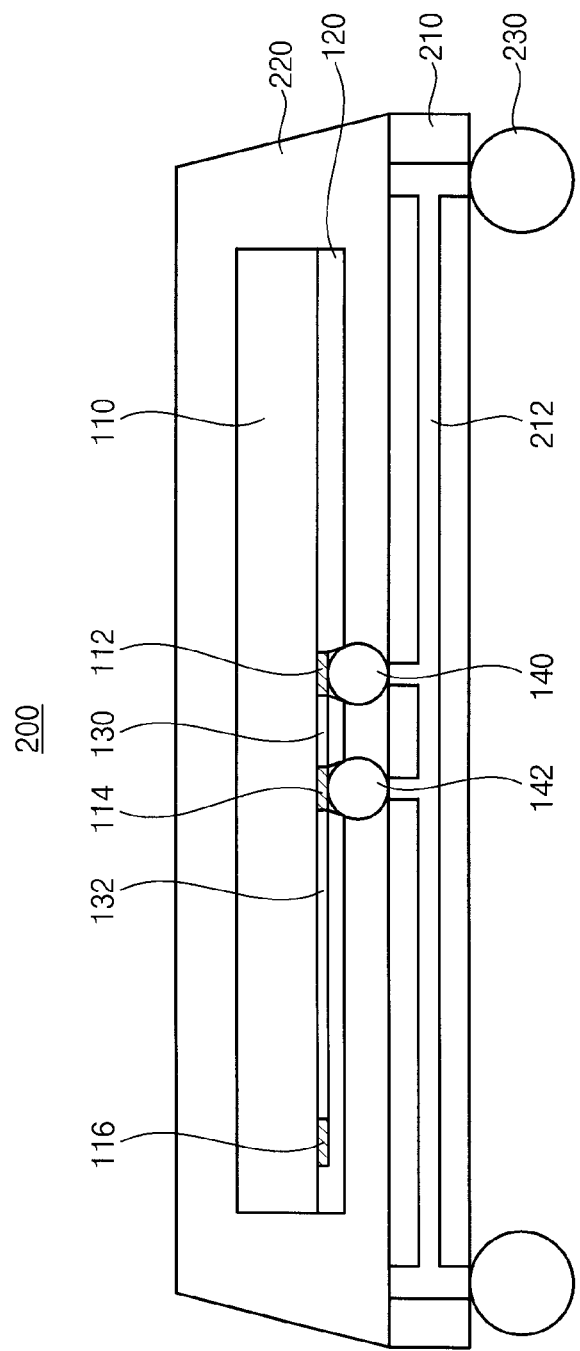
Figure 5:
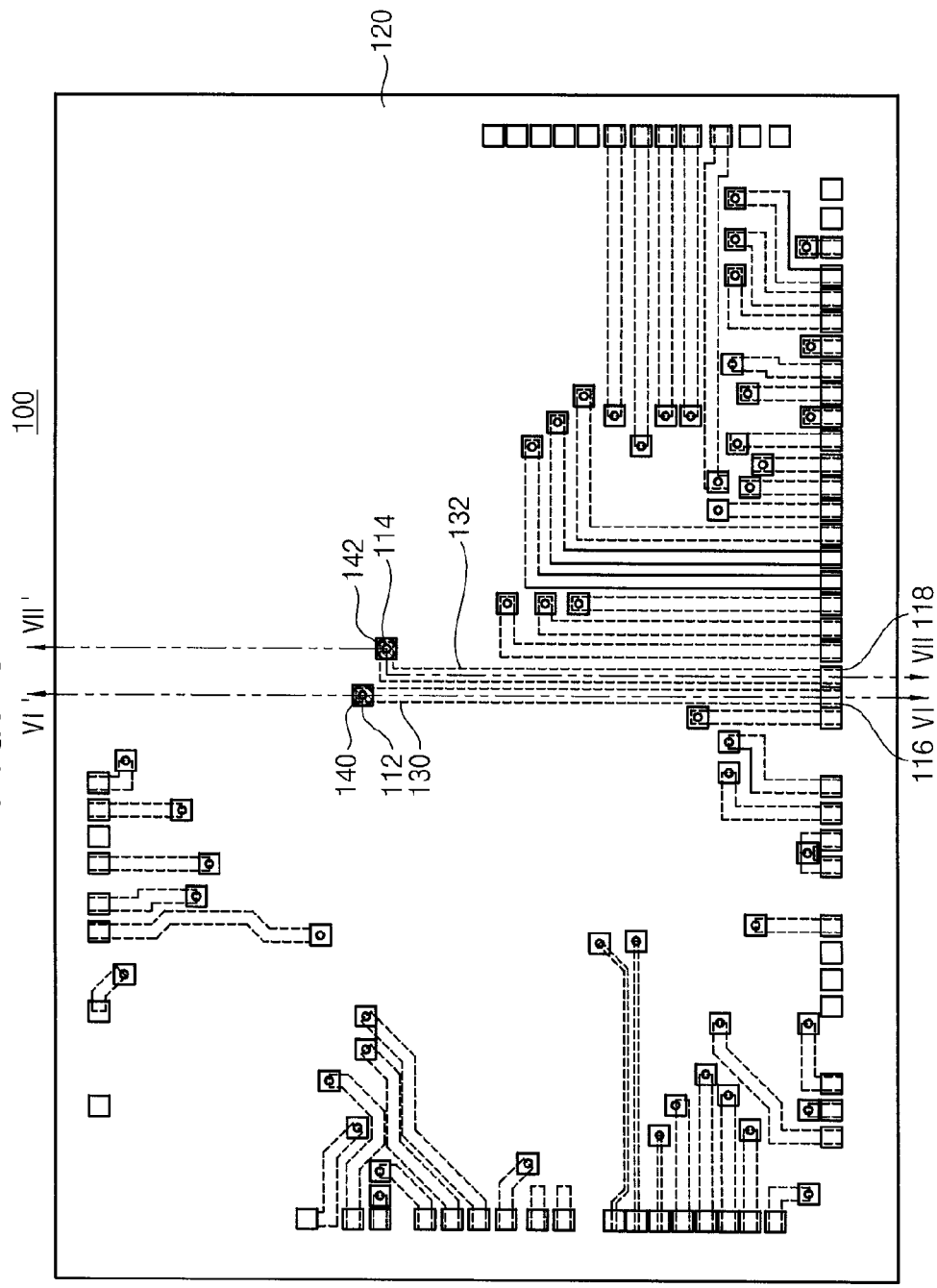
Figure 6:
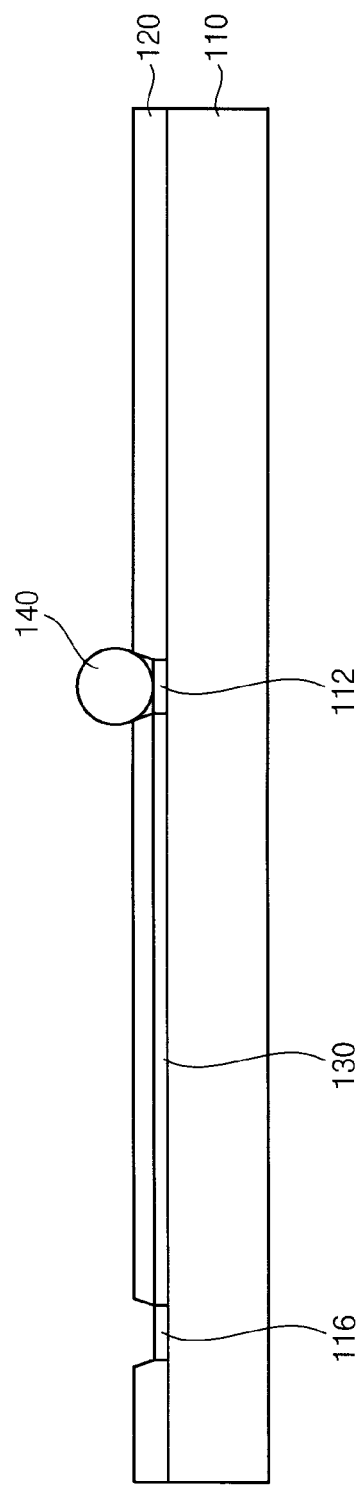
Figure 7:
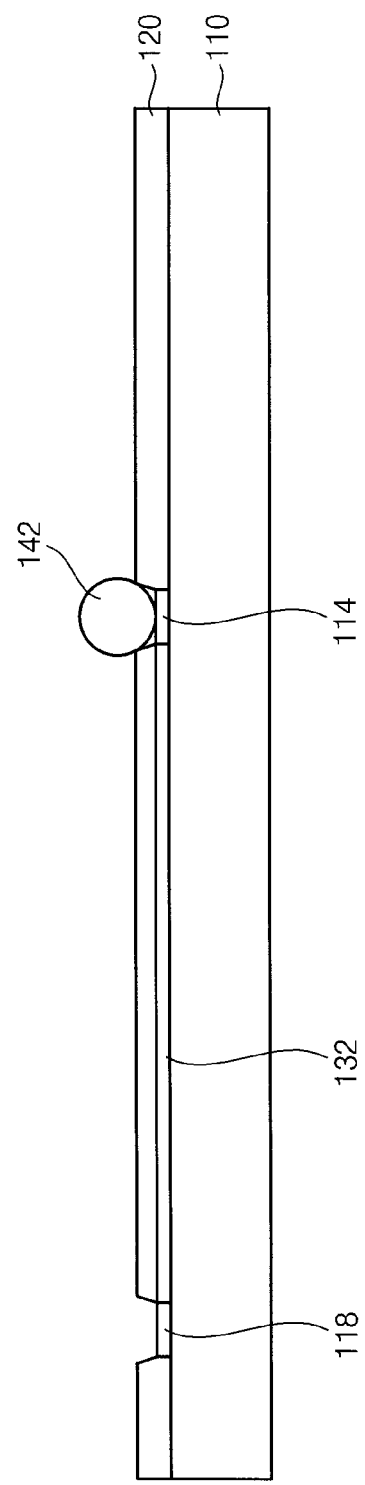

FIG. 4 is a cross-sectional view illustrating a flip chip package including the semiconductor chip in FIG. 1 in accordance with example embodiments, FIG. 5 is a plan view illustrating the flip chip package in FIG. 4, FIG. 6 is a cross-sectional view taken along a line VI-VI' in FIG. 5, and FIG. 7 is a cross-sectional view taken along a line VII-VII' in FIG. 5.

Referring to FIGS. 4 to 7, a flip chip package 200 of this example embodiment may include a semiconductor chip 100, a package substrate 210, a first conductive bump 140, a second conductive bump 142, a molding member 220 and external terminals 230. The flip chip package 200 may use the first central pad 112 and the second central pad 114 as terminals of the flip chip package 200. Particularly, the first central pad 112 connected with the first peripheral pad 116 through the first pad line 130, and the second central pad 114 connected with the second peripheral pad 118 through the second pad line 132 may be used for the terminals of the flip chip package 200.

The semiconductor chip 100 may include elements substantially the same as those of the semiconductor chip 100 in FIG. 1. Thus, the same reference numerals may refer to the same elements and any further illustrations with respect to the same elements may be omitted herein for brevity.

The active face of the semiconductor chip 100 may be downwardly oriented. The package substrate 210 may be arranged under the semiconductor chip 100. Thus, an upper surface of the package substrate 210 may face the active face of the semiconductor chip 100. The package substrate 210 may include a circuit pattern 212. The circuit pattern 212 may have an upper end exposed through the upper surface of the package substrate 210, and a lower end exposed through a lower surface of the package substrate 210.

The first conductive bump 140 may be formed on the first central pad 112. The first conductive bump 140 may be disposed between the first central pad 112 and the upper end of the circuit pattern 212 to electrically connect the first central pad 112 with the circuit pattern 212.

The second conductive bump 142 may be formed on the second central pad 114. The second conductive bump 142 may be disposed between the second central pad 114 and the upper end of the circuit pattern 212 to electrically connect the second central pad 114 with the circuit pattern 212.

The molding member 220 may be formed on the upper surface of the package substrate 210 to cover the semiconductor chip 100. The molding member 220 may function as to protect the semiconductor chip from external environments. The molding member 220 may include an epoxy molding compound (EMC).

The external terminals 230 may be formed on the lower end of the circuit pattern 212 in the package substrate 210. The external terminals 230 may include a solder ball.

Figure 8:
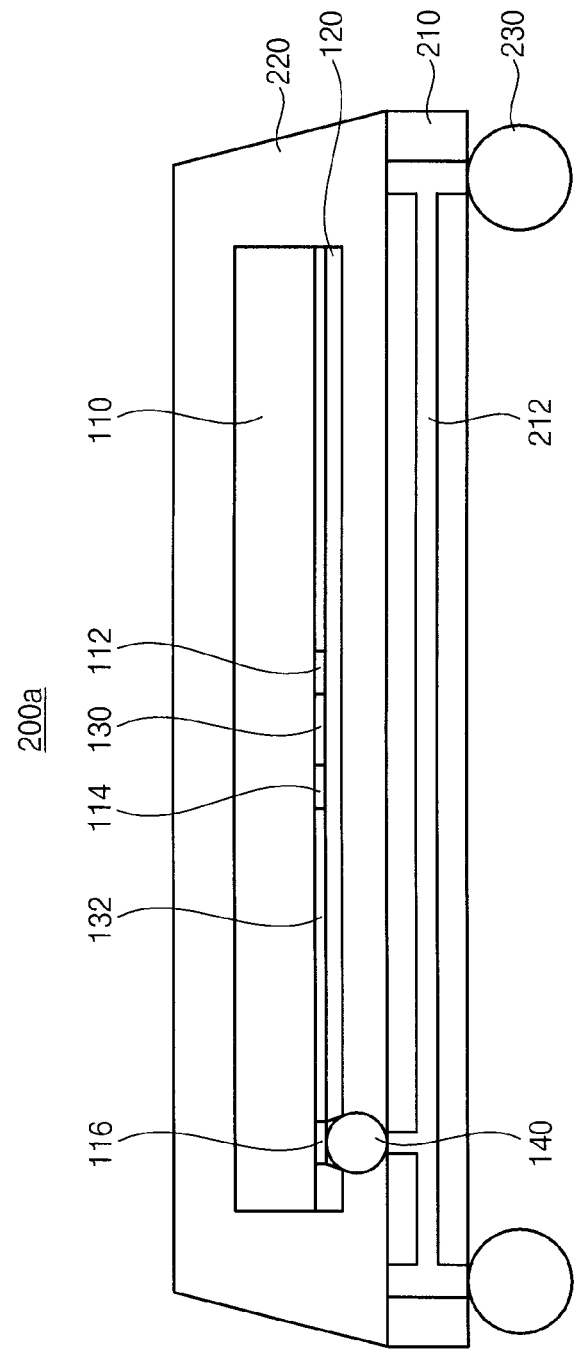
Figure 9:
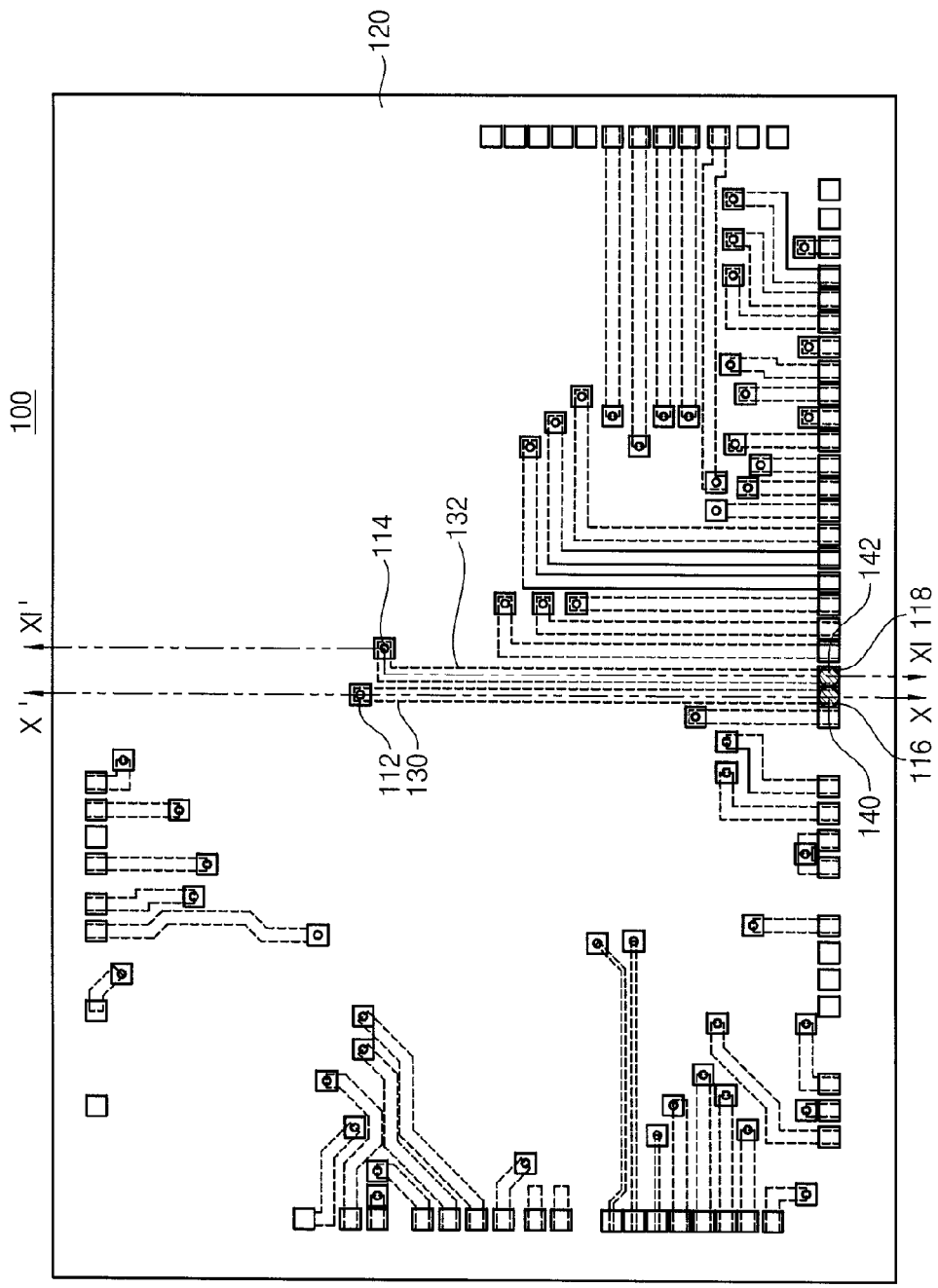
Figure 10:
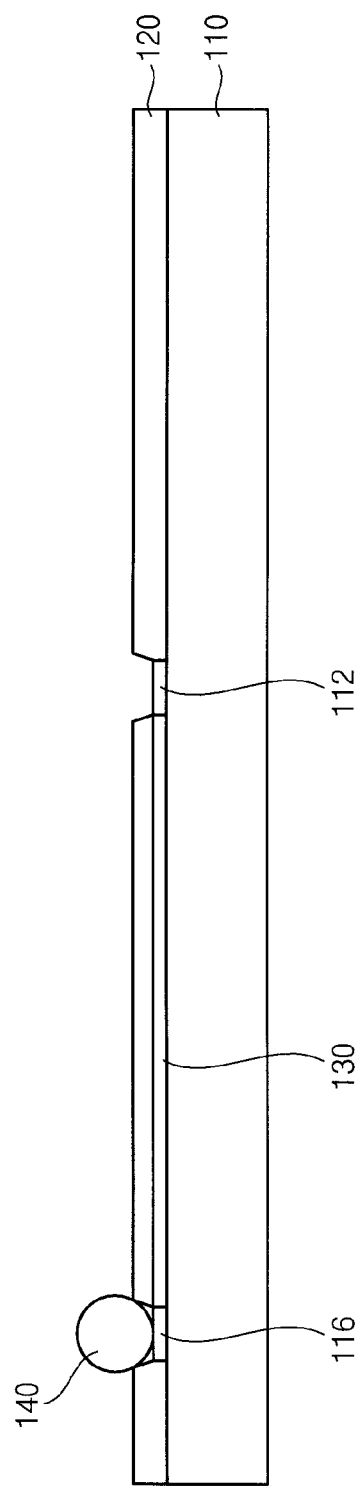
Figure 11:
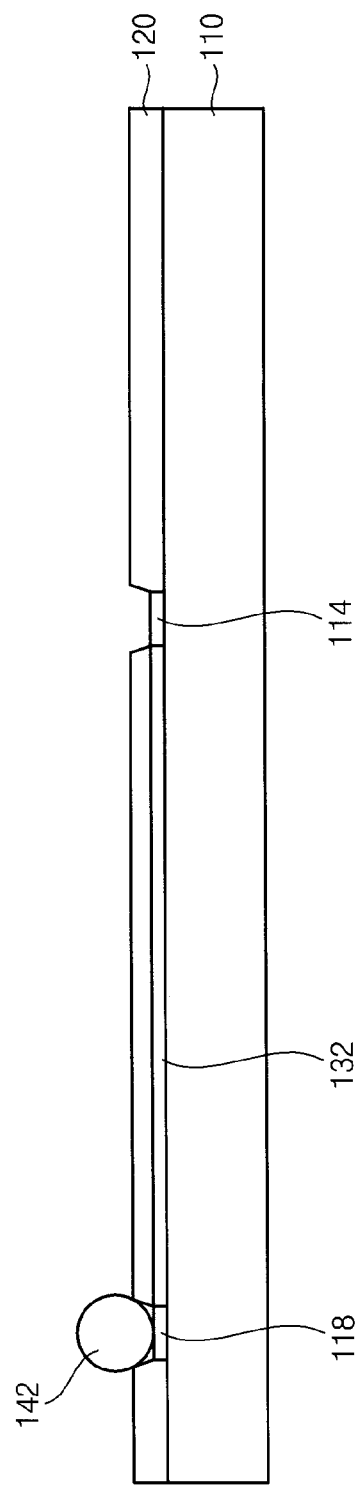

FIG. 8 is a cross-sectional view illustrating a flip chip package including the semiconductor chip in FIG. 1 in accordance with example embodiments, FIG. 9 is a plan view illustrating the flip chip package in FIG. 8, FIG. 10 is a cross-sectional view taken along a line X-X' in FIG. 8, and FIG. 11 is a cross-sectional view taken along a line XI-XI' in FIG. 8.

A flip chip package 200a of this example embodiment may include elements substantially the same as those of the flip chip package 200 in FIG. 4 except for positions of the first and second conductive bumps. Thus, the same reference numerals may refer to the same elements and any further illustrations with respect to the same elements may be omitted herein for brevity.

Referring to FIGS. 8 to 11, a flip chip package 200a of this example embodiment may use the first peripheral pad 116 and the second peripheral pad 118 as terminals of the flip chip package 200a. Particularly, the first peripheral pad 116 connected with the first central pad 112 through the first pad line 130, and the second peripheral pad 118 connected with the second central pad 114 through the second pad line 132 may be used for the terminals of the flip chip package 200.

The first conductive bump 140 may be formed on the first peripheral pad 116. The first conductive bump 140 may be disposed between the first peripheral pad 116 and the upper end of the circuit pattern 212 to electrically connect the first peripheral pad 116 with the circuit pattern 212.

The second conductive bump 142 may be formed on the second peripheral pad 118. The second conductive bump 142 may be disposed between the second peripheral pad 118 and the upper end of the circuit pattern 212 to electrically connect the second peripheral pad 118 with the circuit pattern 212.

Figure 12:
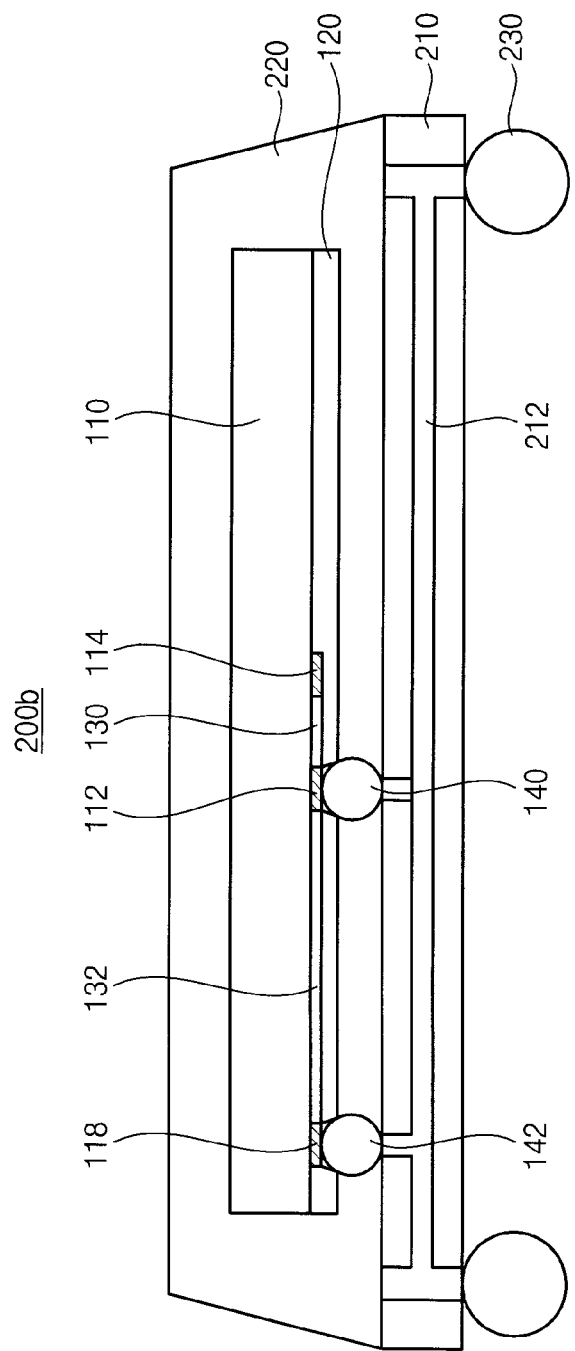
Figure 13:
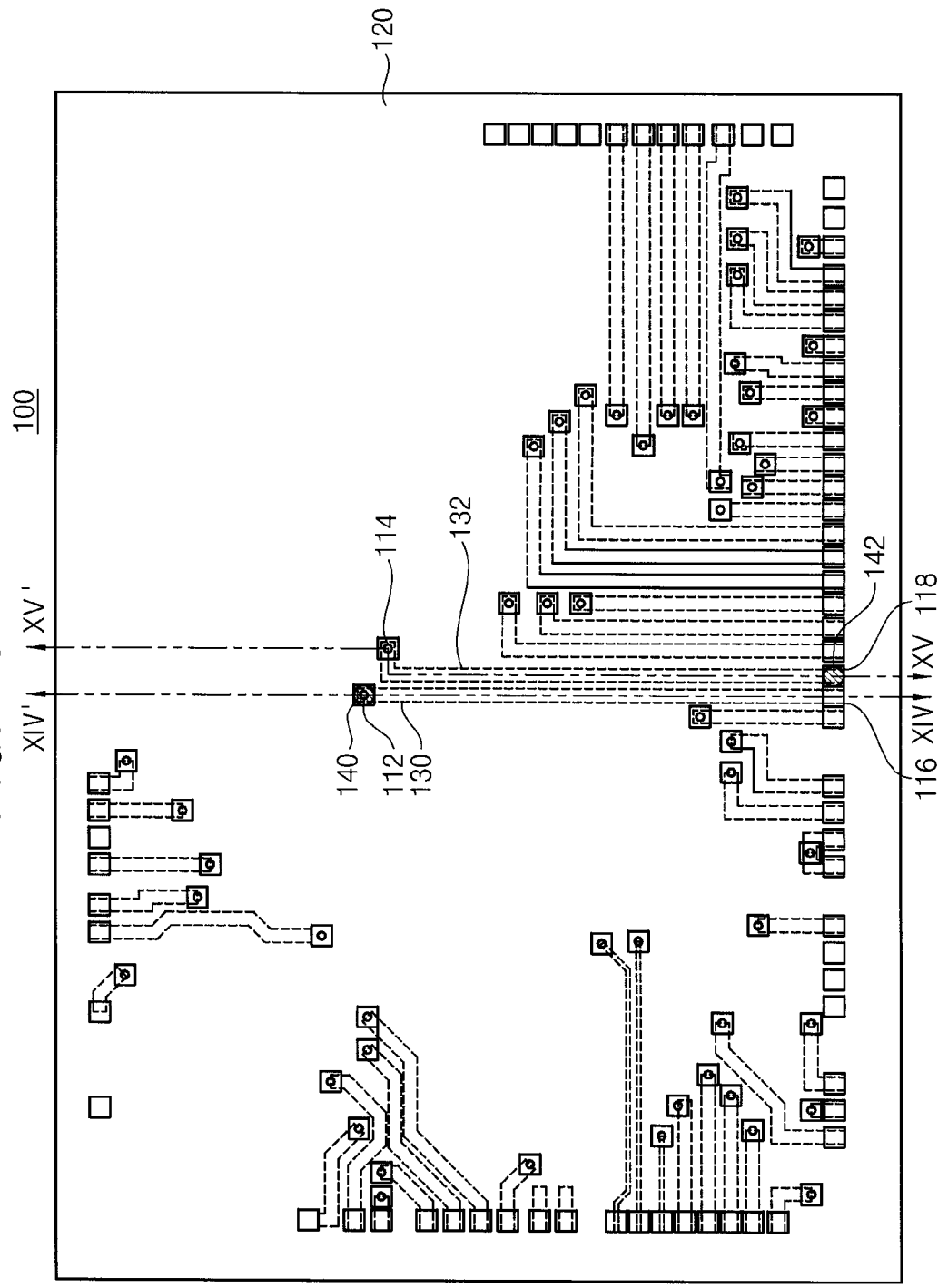
Figure 14:
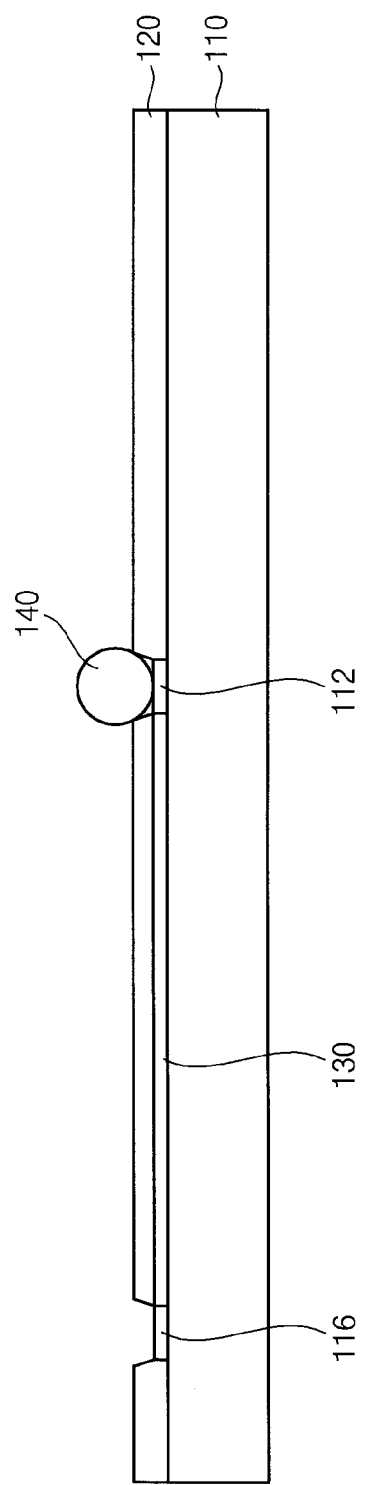
Figure 15:
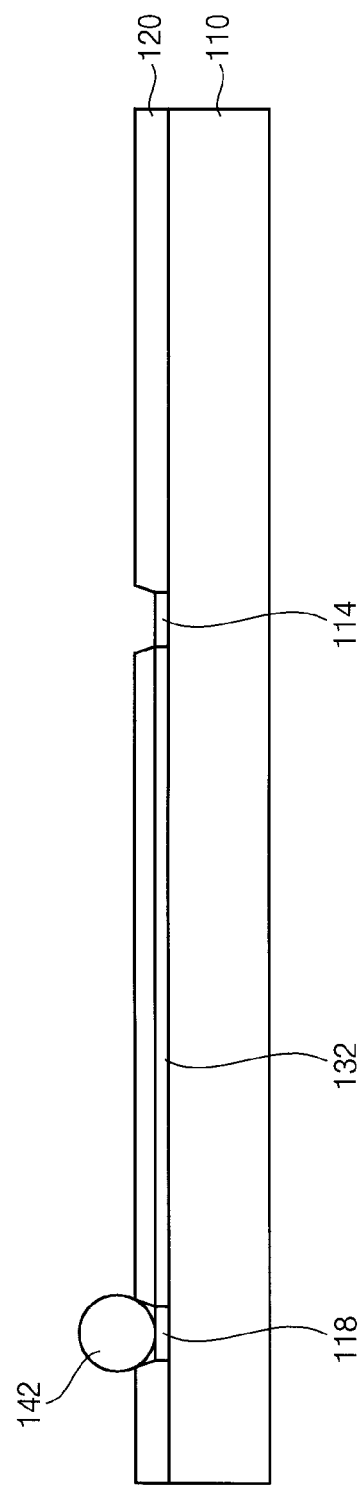

FIG. 12 is a cross-sectional view illustrating a flip chip package including the semiconductor chip in FIG. 1 in accordance with example embodiments, FIG. 13 is a plan view illustrating the flip chip package in FIG. 12, FIG. 14 is a cross-sectional view taken along a line XIV-XIV' in FIG. 12, and FIG. 15 is a cross-sectional view taken along a line XV-XV' in FIG. 12.

A flip chip package 200b of this example embodiment may include elements substantially the same as those of the flip chip package 200 in FIG. 4 except for positions of the first and second conductive bumps. Thus, the same reference numerals may refer to the same elements and any further illustrations with respect to the same elements may be omitted herein for brevity.

Referring to FIGS. 12 to 15, a flip chip package 200b of this example embodiment may use the first central pad 112 and the second peripheral pad 118 as terminals of the flip chip package 200b. Particularly, the first central pad 112 connected with the first peripheral pad 116 through the first pad line 130, and the second peripheral pad 118 connected with the second central pad 114 through the second pad line 132 may be used for the terminals of the flip chip package 200.

The first conductive bump 140 may be formed on the first central pad 112. The first conductive bump 140 may be disposed between the first central pad 112 and the upper end of the circuit pattern 212 to electrically connect the first central pad 112 with the circuit pattern 212.

The second conductive bump 142 may be formed on the second peripheral pad 118. The second conductive bump 142 may be disposed between the second peripheral pad 118 and the upper end of the circuit pattern 212 to electrically connect the second peripheral pad 118 with the circuit pattern 212.

Therefore, the first conductive bump 140 and the second conductive bump 142 may be alternately formed on the central pad and the peripheral pad so that a sufficient wide pitch may be formed between the first conductive bump 140 and the second conductive bump 142. Thus, an electrical short between the first conductive bump 140 and the second conductive bump 142 may be prevented. As a result, efficient arrangement of the pads for forming the bumps may be accomplished.

Wafer Level Package

Figure 16:
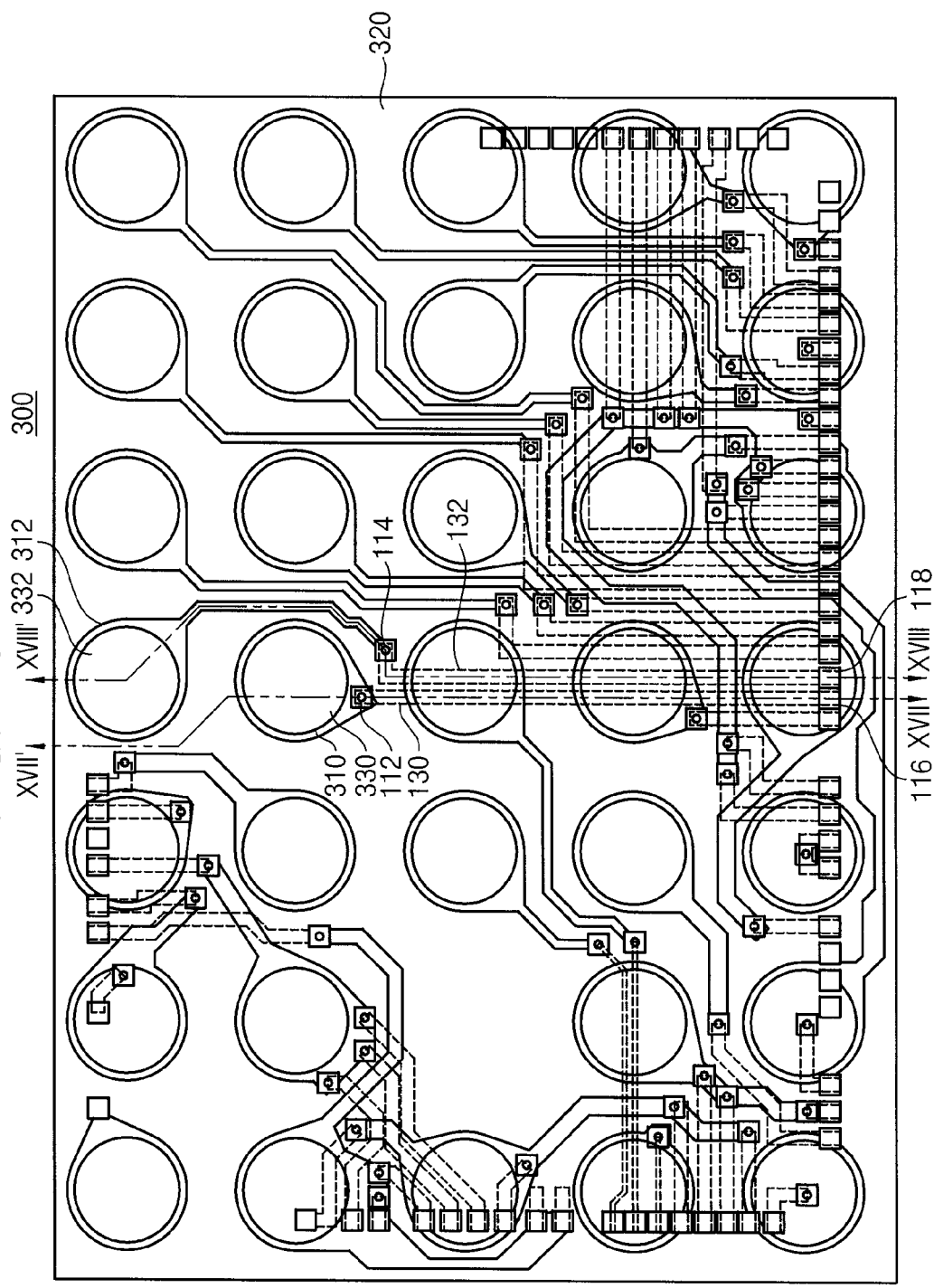
Figure 17:
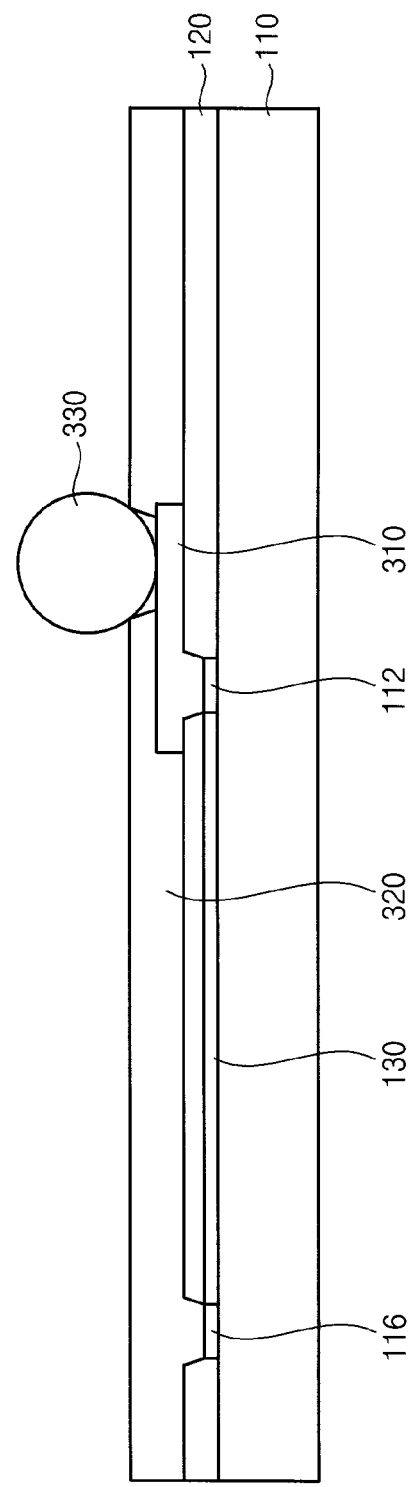
Figure 18:
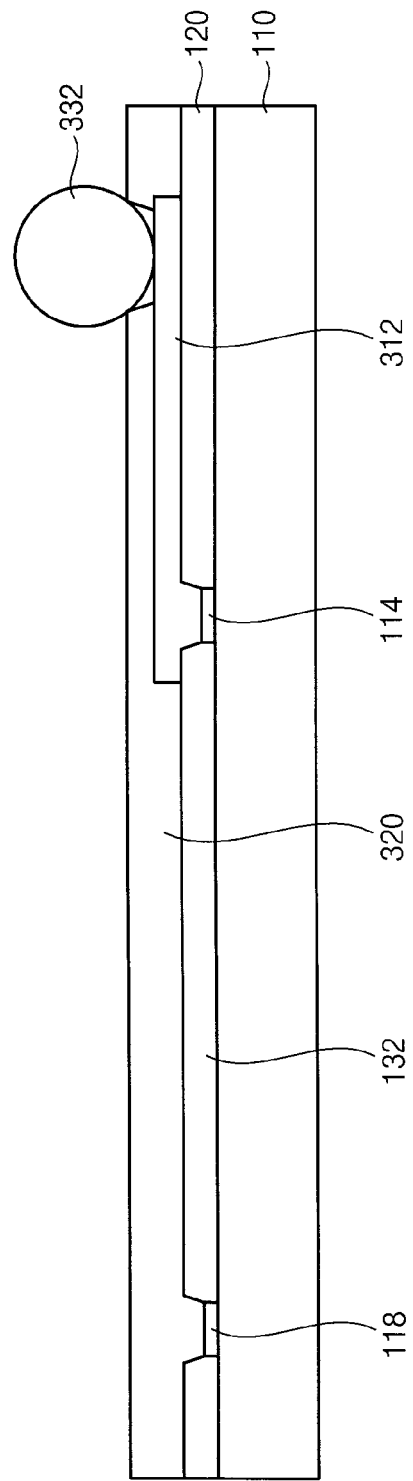

FIG. 16 is a cross-sectional view illustrating a wafer level package including the semiconductor chip in FIG. 1 in accordance with example embodiments, and FIG. 17 is a cross-sectional view taken along a line XVII-XVII' in FIG. 16, FIG. 18 is a cross-sectional view taken along a line XVIII-XVIII' in FIG. 16.

Referring to FIGS. 16 to 18, a wafer level package 300 of this example embodiment may include a semiconductor chip 100, a first redistribution layer 310, a second redistribution layer 312, an insulating pattern 320, a first external terminal 330 and a second external terminal 332.

The semiconductor chip 100 may include elements substantially the same as those of the semiconductor chip 100 in FIG. 1. Thus, the same reference numerals may refer to the same elements and any further illustrations with respect to the same elements may be omitted herein for brevity.

The first redistribution layer 310 may be formed on the passivation layer 120. The first redistribution layer 310 may be electrically connected to the first central pad 112. In one embodiment, the first redistribution layer 310 may extend from the first central pad 112 and may be electrically connected to the first central pad 112. Alternatively, the first redistribution layer 310 may be electrically connected to the first peripheral pad 116. In one embodiment, the first redistribution layer 310 may extend from the first peripheral pad and may be electrically connected to the first peripheral pad 116. Because the first central pad 112 may be connected with the first peripheral pad 116 through the first pad line 130, the first redistribution layer 310 may be configured to extend from any one of the first central pad 112 and the first peripheral pad 116. The first redistribution layer 310 may be disposed in any suitable positions on the passivation layer 120. In some embodiments, the first redistribution layer 310 may be disposed adjacent to the first central pad. In some embodiments, the first redistribution layer 310 may be disposed spaced apart from the first central pad.

The second redistribution layer 312 may be formed on the passivation layer 120. The second redistribution layer 312 may be electrically connected to the second central pad 114. In one embodiment, the second redistribution layer 312 may extend from the second central pad 114 and may be electrically connected to the second central pad 114. Alternatively, the second redistribution layer 312 may be electrically connected to the second peripheral pad 118. In one embodiment, the second redistribution layer 312 may extend from the second peripheral pad 118 and may be electrically connected to the second peripheral pad 118. Because the second central pad 114 may be connected with the second peripheral pad 118 through the second pad line 132, the second redistribution layer 312 may be extended from any one of the second central pad 114 and the second peripheral pad 118. The second redistribution layer 312 may be disposed in any suitable positions on the passivation layer 120. In some embodiments, the second redistribution layer 312 may be disposed adjacent to the second central pad. In some embodiments, the second redistribution layer 312 may be spaced apart from the second central pad. In some embodiments, the second redistribution layer 312 may be spaced apart from the second central pad and the second peripheral pad.

Additionally, the wafer level package 300 may be embodied into a fan-out wafer level package by extending the first redistribution layer 310 and the second redistribution layer 312 to a position beyond the side surface of the semiconductor chip 100.

The insulating pattern 320 may be formed on the upper surface of the passivation layer 120. The insulating pattern 320 may have openings configured to expose the first redistribution layer 310 and the second redistribution layer 312 or partially expose the first redistribution layer 310 and the second redistribution layer 312.

The first external terminal 330 may be formed on the first redistribution layer 310 exposed through the opening of the insulating pattern 320. The first external terminal 330 may include a solder ball.

The second external terminal 332 may be formed on the second redistribution layer 312 exposed through the opening of the insulating pattern 320. The second external terminal 332 may include a solder ball.

Alternatively, the wafer level package 300 may not include the redistribution layers. The wafer level package 300 may include ball lands formed on any one of the first central pad 112 and the first peripheral pad 116, and any one of the second central pad 114 and the second peripheral pad 118. In this case, the first external terminal 330 and the second external terminal 332 may be formed on the ball lands.

Figure 19:
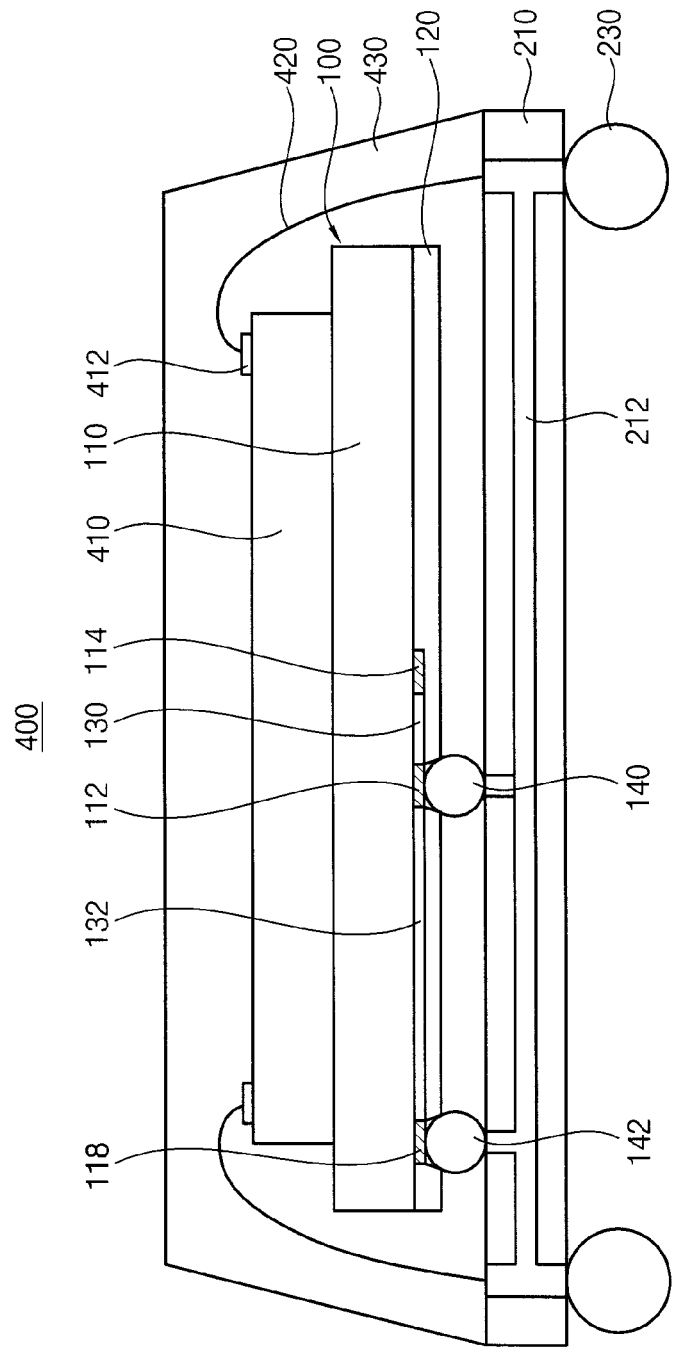

FIG. 19 is a cross-sectional view illustrating a system-in-package including the semiconductor chip in FIG. 1 in accordance with example embodiments.

A system-in-package 400 of this example embodiment may include elements substantially the same as those of the flip chip package 200 in FIG. 4 except for further including a second semiconductor chip. Thus, the same reference numerals may refer to the same elements and any further illustrations with respect to the same elements may be omitted herein for brevity.

Referring to FIG. 19, a second semiconductor chip 410 may be stacked on an upper surface of the semiconductor chip 100. The second semiconductor chip 410 may be attached to the upper surface of the semiconductor chip 100 using an adhesive. The second semiconductor chip 410 may include second bonding pads 412. The second bonding pads 412 may be arranged on an edge portion of an upper surface of the second semiconductor chip 410. Thus, the upper surface of the second semiconductor chip 410 may correspond to an active face of the second semiconductor chip 410. The second semiconductor chip 410 may include a control chip. Alternatively, the semiconductor chip 100 and the second semiconductor chip 410 may include a memory chip.

The second semiconductor chip 410 may be electrically connected with the package substrate 210 through conductive wires 420. Each of the conductive wires 420 may include an upper end connected to the second bonding pad 412 of the second semiconductor chip 410, and a lower end connected to the upper end of the circuit pattern 212 of the package substrate 210.

A molding member 430 may be formed on the upper surface of the package substrate 210 to cover the semiconductor chip 100 and the second semiconductor chip 410. The molding member 430 may protect the semiconductor chip 100, the second semiconductor chip 410 and the conductive wires 420 from external environments. The molding member 430 may include an EMC.

Alternatively, the system-in-package 400 may include the flip chip package 200 in FIG. 4 or the flip chip package 200a in FIG. 8.

According to example embodiments, the first central pad and the first peripheral pad may be connected with each other by the first pad line, and the second central pad and the second peripheral pad may be connected with each other by the second pad line. Thus, the first peripheral pad and the second peripheral pad as well as the first central pad and the second central pad may be used for a bonding pad in the flip chip package or a connecting pad of the redistribution layer the wafer level package. As a result, a pitch between the conductive bumps may be widened so that the semiconductor chip may be used for the flip chip package, the wafer level package, a fan-out wafer level package, etc., without changes of pad arrangements.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor chip comprising:
a semiconductor substrate having an active face;
a first central pad and a second central pad arranged on a central region of the active face;
a first peripheral pad and a second peripheral pad arranged on an edge region of the active face;
a first pad line electrically connecting the first central pad with the first peripheral pad;
a second pad line electrically connecting the second central pad with the second peripheral pad; and
a passivation layer formed on the active face to cover the first pad line and the second pad line, the passivation layer having openings configured to expose the first central pad, the second central pad, the first peripheral pad and the second peripheral pad.

2. The semiconductor chip of claim 1, wherein the first central pad is positioned adjacent to the second central pad, and the first peripheral pad is positioned adjacent to the second peripheral pad.

3. The semiconductor chip of claim 2, wherein the first peripheral pad and the second peripheral pad are arranged in a row along a first direction substantially parallel to a side of the semiconductor substrate.

4. The semiconductor chip of claim 3, wherein the first central pad and the second central pad are arranged in a row along the first direction.

5. The semiconductor chip of claim 3, wherein the first central pad and the second central pad are arranged in a row along a second direction substantially perpendicular to the first direction.

6. The semiconductor chip of claim 5, wherein the first central pad and the second central pad are arranged offset from each other in a first direction parallel to a side of the semiconductor substrate and a second direction perpendicular to the first direction.

7. The semiconductor chip of claim 1, wherein the first central pad, the first peripheral pad and the first pad line have upper surfaces substantially coplanar with each other.

8. The semiconductor chip of claim 1, wherein the second central pad, the second peripheral pad and the second pad line have upper surfaces substantially coplanar with each other.

9. A flip chip package comprising:
a semiconductor chip including a semiconductor substrate, a first central pad, a first peripheral pad, a first pad line electrically connecting the first central pad with the first peripheral pad, a second central pad, a second peripheral pad, and a second pad line electrically connecting the second central pad with the second peripheral pad, wherein the semiconductor substrate has an active face, the first central pad and the second central pad are arranged on a central region of the active face, and the first peripheral pad and the second peripheral pad are arranged on an edge region of the active face;
a package substrate disposed opposite to the active face of the semiconductor chip; and
first and second conductive bumps electrically connecting the semiconductor chip with the package substrate, wherein the first conductive bump is disposed between the first peripheral pad and the package substrate, and the second conductive bump is disposed between the second peripheral pad and the package substrate.

10. The flip chip package of claim 9, further comprising a molding member formed on the package substrate to cover the semiconductor chip.

11. The flip chip package of claim 9, further comprising a second semiconductor chip stacked on the semiconductor chip, the second semiconductor chip electrically connected with the package substrate.

12. The flip chip package of claim 11, further comprising a conductive wire electrically connecting the second semiconductor chip and the package substrate.

13. A flip chip package comprising:
a semiconductor chip including a semiconductor substrate, a first central pad, a first peripheral pad, a first pad line electrically connecting the first central pad with the first peripheral pad, a second central pad, a second peripheral pad, and a second pad line electrically connecting the second central pad with the second peripheral pad, wherein the semiconductor substrate has an active face, the first central pad and the second central pad are arranged on a central region of the active face, and the first peripheral pad and the second peripheral pad are arranged on an edge region of the active face;
a package substrate disposed opposite to the active face of the semiconductor chip; and
first and second conductive bumps electrically connecting the semiconductor chip with the package substrate,
wherein the first conductive bump is disposed between the first central pad and the package substrate, and the second conductive bump is disposed between the second peripheral pad and the package substrate.

14. A wafer level chip package comprising:
a semiconductor chip including a semiconductor substrate, a first central pad, a first peripheral pad, a first pad line electrically connecting the first central pad with the first peripheral pad, a second central pad, a second peripheral pad, a second pad line electrically connecting the second central pad with the second peripheral pad, wherein the semiconductor substrate has an active face, the first central pad and the second central pad are arranged on a central region of the active face, and the first peripheral pad and the second peripheral pad are arranged on an edge region of the active face;
a first redistribution layer extending from the first central pad or the first peripheral pad;
a second redistribution layer extending from the second central pad or the second peripheral pad; and
a first external terminal formed on the first redistribution layer and a second external terminal formed on the second redistribution layer.

15. The wafer level package of claim 14, further comprising a passivation layer formed on the active face to cover the first pad line and the second pad line, wherein the passivation layer has openings to expose the first central pad, the second central pad, the first peripheral pad and the second peripheral pad, and wherein the first redistribution layer and the second redistribution layer are formed on the passivation layer.

16. The wafer level package of claim 14, further comprising an insulating pattern formed on an upper surface of the passivation layer, the insulating pattern having openings configured to partially expose the first redistribution layer and the second redistribution layer.

17. The wafer level package of claim 14, wherein the second redistribution layer is spaced apart from the second central pad and the second peripheral pad.

* * * * *